United States Patent
Nakamura

(10) Patent No.: US 7,955,910 B2
(45) Date of Patent: Jun. 7, 2011

(54) SEMICONDUCTOR DEVICE AND MANUFACTURING METHOD THEREOF

(75) Inventor: Osamu Nakamura, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 12/491,796

(22) Filed: Jun. 25, 2009

(65) Prior Publication Data

US 2009/0325376 A1 Dec. 31, 2009

Related U.S. Application Data

(62) Division of application No. 10/809,118, filed on Mar. 25, 2004, now Pat. No. 7,554,117.

(30) Foreign Application Priority Data

Mar. 26, 2003 (JP) ................................ 2003-086425

(51) Int. Cl.
*H01L 21/00* (2006.01)
*H01L 21/84* (2006.01)

(52) U.S. Cl. .................... 438/149; 438/151; 257/E21.32

(58) Field of Classification Search .................. 438/128, 438/149, 151, 157, 283; 257/E21.32, E21.561, 257/E21.7
See application file for complete search history.

(56) References Cited

U.S. PATENT DOCUMENTS

| 4,733,097 | A | * | 3/1988 | Iwabuchi et al. | ............. 358/482 |
|---|---|---|---|---|---|
| 5,117,299 | A | | 5/1992 | Kondo et al. | |
| 5,132,248 | A | | 7/1992 | Drummond et al. | |
| 5,132,676 | A | | 7/1992 | Kimura et al. | |
| 5,155,564 | A | | 10/1992 | Hishida et al. | |
| 5,210,050 | A | | 5/1993 | Yamazaki et al. | |
| 5,240,801 | A | | 8/1993 | Hayashi et al. | |
| 5,330,616 | A | | 7/1994 | Yamazaki | |
| 5,386,623 | A | * | 2/1995 | Okamoto et al. | ............... 29/832 |
| 5,583,369 | A | | 12/1996 | Yamazaki et al. | |
| 5,592,318 | A | | 1/1997 | Majima et al. | |
| 5,643,826 | A | | 7/1997 | Ohtani et al. | |
| 5,652,667 | A | | 7/1997 | Kurogane | |
| 5,706,067 | A | | 1/1998 | Colgan et al. | |
| 5,739,890 | A | | 4/1998 | Uda et al. | |
| 5,754,263 | A | | 5/1998 | Akiyama et al. | |

(Continued)

FOREIGN PATENT DOCUMENTS

EP 0 349 255 B1 12/1997

(Continued)

OTHER PUBLICATIONS

Wong, W.S. et al, "Amorphous Silicon Thin-Film Transistors and Arrays Fabricated by Jet Printing," Applied Physics Letters, vol. 80, No. 4, Jan. 28, 2002, pp. 610-612.

(Continued)

*Primary Examiner* — Hoai V Pham
(74) *Attorney, Agent, or Firm* — Husch Blackwell LLP

(57) ABSTRACT

An island-like interlayer insulating film is formed selectively in a region where a source interconnection and a gate interconnection intersect. For example, by use of ink jet method, a solution containing an insulating material is dropped on a region where the gate interconnection and the source interconnection intersect or a region where a holding capacitor is formed, that enable to reduce a photolithography process and to reduce the number of masks that are used in a TFT.

12 Claims, 7 Drawing Sheets

U.S. PATENT DOCUMENTS

| | | | |
|---|---|---|---|
| 5,757,054 | A | 5/1998 | Miyawaki et al. |
| 5,767,827 | A | 6/1998 | Kobayashi et al. |
| 5,910,271 | A | 6/1999 | Ohe et al. |
| 5,933,204 | A | 8/1999 | Fukumoto |
| 5,946,561 | A | 8/1999 | Yamazaki et al. |
| 5,949,107 | A | 9/1999 | Zhang |
| 6,008,876 | A | 12/1999 | Moore |
| 6,037,197 | A | 3/2000 | Yamazaki et al. |
| 6,049,132 | A | 4/2000 | Iwahashi et al. |
| 6,294,401 | B1 | 9/2001 | Jacobson et al. |
| 6,294,815 | B1 | 9/2001 | Yamazaki et al. |
| 6,326,249 | B1 | 12/2001 | Yamazaki et al. |
| 6,362,507 | B1 | 3/2002 | Ogawa et al. |
| 6,420,758 | B1 | 7/2002 | Nakajima |
| 6,448,577 | B1 | 9/2002 | Yamazaki et al. |
| 6,468,844 | B1 | 10/2002 | Yamazaki et al. |
| 6,514,801 | B1 | 2/2003 | Yudasaka et al. |
| 6,556,264 | B1 | 4/2003 | Hirakata et al. |
| 6,635,508 | B2 | 10/2003 | Arai et al. |
| 6,713,389 | B2 | 3/2004 | Speakman |
| 6,715,871 | B2 | 4/2004 | Hashimoto et al. |
| 6,794,220 | B2 | 9/2004 | Hirai et al. |
| 6,794,229 | B2 | 9/2004 | Asami et al. |
| 6,953,951 | B2 | 10/2005 | Yamazaki et al. |
| 7,034,339 | B2 | 4/2006 | Matsuura et al. |
| 7,053,890 | B2 | 5/2006 | Inukai |
| 2002/0020839 | A1 | 2/2002 | Yamazaki et al. |
| 2002/0070382 | A1 | 6/2002 | Yamazaki et al. |
| 2002/0179901 | A1 | 12/2002 | Arai et al. |
| 2003/0010283 | A1 | 1/2003 | Yamazaki et al. |
| 2003/0030689 | A1 | 2/2003 | Hashimoto et al. |
| 2003/0054653 | A1 | 3/2003 | Yamazaki et al. |
| 2003/0059987 | A1 | 3/2003 | Sirringhaus et al. |
| 2004/0075093 | A1 | 4/2004 | Arai et al. |
| 2004/0147066 | A1 | 7/2004 | Yamazaki et al. |
| 2004/0238124 | A1* | 12/2004 | Nakamura .......... 156/345.43 |
| 2004/0253835 | A1 | 12/2004 | Kawase |

FOREIGN PATENT DOCUMENTS

| | | |
|---|---|---|
| EP | 1 178 462 A2 | 2/2002 |
| EP | 1 263 062 A2 | 12/2002 |
| JP | 62-229957 | 10/1987 |
| JP | 1-284831 | 11/1989 |
| JP | 2-13928 | 1/1990 |
| JP | 3-3351 | 1/1991 |
| JP | 4-151819 | 5/1992 |
| JP | 5-338187 | 12/1993 |
| JP | 6-177380 | 6/1994 |
| JP | 6-182980 | 7/1994 |
| JP | 6-237063 | 8/1994 |
| JP | 7-130652 | 5/1995 |
| JP | 8-204008 | 8/1996 |
| JP | 10-270843 | 10/1998 |
| JP | 10-303428 | 11/1998 |
| JP | 2000-133649 | 5/2000 |
| JP | 2001-52864 | 2/2001 |
| JP | 2002-305297 | 10/2002 |
| JP | 2002-324966 | 11/2002 |
| JP | 2002-359246 | 12/2002 |
| JP | 2002-359374 | 12/2002 |
| JP | 2003-80694 | 3/2003 |
| TW | 522454 | 3/2003 |

OTHER PUBLICATIONS

Fuller, S.B. et al, "Ink-Jet Printed Nanoparticle Microelectromechanical Systems," Micro Electro Mechanical Systems, vol. 11, No. 1, 2002, pp. 54-60.

Office Action re Taiwanese application No. TW 93108405, dated Apr. 19, 2010 (with English translation).

International Search Report re application No. PCT/JP2004/003715, dated Jun. 8, 2004 (in Japanese).

Written Opinion re application No. PCT/JP2004/003715, dated Jun. 8, 2004 (with partial English translation).

* cited by examiner (intersection of interconnections)　　(TFT)　　(holding capacitor)

(intersection of interconnections) (TFT) (holding capacitor)

TECHNICAL FIELD

SEMICONDUCTOR DEVICE AND MANUFACTURING METHOD THEREOF

This application is a divisional of copending application Ser. No. 10/809,118 filed on Mar. 25, 2004 now U.S. Pat. No. 7,554,117.

TECHNICAL FIELD

The present invention relates to a method of manufacturing a semiconductor device, in particular, a semiconductor device that has a circuit constituted of an active matrix type field effect thin film transistor (hereinafter, referred to as a TFT) on a substrate having an insulating surface and a method of manufacturing the same.

BACKGROUND OF THE INVENTION

In recent years, large size liquid crystal display devices are gathering attention and vigorous efforts are being forwarded to realize low cost liquid crystal panels. However, as to TFT substrates, the effort to reduce the cost is belated. On the occasion of forming an image display element in a liquid crystal display device, a lot of manufacturing steps such as a deposition step, an etching step, a doping step, a washing step, a photolithography step, an ashing step and a heat treatment step are necessary. Accordingly, high manufacturing costs and personnel costs are necessary.

A reason for that a manufacturing process cannot be more simplified than ever is present in a TFT structure. That is, since interconnections are formed into a multi-layered structure to realize cubic crossings, contact holes are necessary to be formed, resulting in an increase in the number of steps.

In what follows, a manufacturing process of a TFT with a polycrystalline silicon film in an active layer will be shown.
1. Formation of active layer
2. Formation of gate insulating film, gate electrode and gate interconnection
3. Source/drain dope
4. Deposition of interlayer insulating film
5. Formation of contact hole
6. Formation of interconnection Following the formation of the interconnections, a protective film is deposited, followed by further forming contact holes, further followed by connecting to pixel electrodes corresponding to electro-optical elements, and thereby a TFT substrate comes to completion. With reference to FIG. 7, in what follows, explanations of 1 through 6 will be given.

Firstly, on a glass substrate 701, an island-like semiconductor layer 702 is formed. An amorphous silicon film that is deposited, typically, by means of a CVD method is crystallized by use of a laser annealing method, a thermal annealing method or an RTA method and the like; a predetermined region that is to be an active layer is covered with a resist mask; a polycrystalline silicon film that is not covered with the resist is removed by use of a dry etching device; and thereby an island-like semiconductor layer is formed.

After the formation of island-like semiconductor layer, over an entire surface of the substrate, by means of a plasma CVD method or a sputtering method, an insulating film and a conductive layer are sequentially formed; a resist mask is disposed on a predetermined region; and the insulating film and the conductive film are etched to form a gate insulating film 703, a gate electrode 704 and a gate interconnection 705.

In the next place, by use of an ion doping method, impurity atoms that impart the n-type and impurity atoms that impart the p-type are doped in predetermined regions to form source/drain regions of an n-channel type TFT and a p-channel type TFT. In order to selectively dope in predetermined regions, a resist mask is used.

After the source/drain regions are formed, in order to electrically activate doped impurity atoms, a thermal annealing method, an RTA method or a laser annealing method is applied to activate. In some cases, the activation process is applied after the formation of an interlayer insulating film. Furthermore, in order to terminate dangling bonds at an interface between the active layer and the gate insulating film, with a silicon nitride film or a silicon nitride oxide film deposited, usually, the hydrogenation is applied. Subsequently, an interlayer insulating film 706 is formed.

After the interlayer insulating film 706 is formed, a resist mask is disposed in a predetermined region, followed by etching to form a contact hole in an interlayer insulating film on a source/drain region and a gate interconnection. The etching is carried out by means of a dry etching method or a wet etching method.

After the contact hole is formed, by means of a sputtering method, an interconnection metal is deposited, followed by disposing a resist mask on a predetermined region, and followed by etching to form a source interconnection 707. After the formation of the source interconnection, through the contact hole, the respective interconnections and the source/drain region and the gate interconnection are electrically connected.

Thus, manufacturing steps of the TFT manufacture are numerous and these can be never omitted, that is, these are indispensable processes. The TFT manufacturing process with a polycrystalline silicon film is explained as an example; however, even in the manufacturing process of a display device with amorphous Si in an active layer, the situation is the same.

For instance, in a TFT that is used in a large size liquid crystal display device and uses amorphous Si, in general, an inversed stagger structure or a stagger structure is adopted. In this case also, a TFT has to be formed according to a complicated manufacturing process that makes use of photolithography; accordingly, there is a problem similar to that in the TFT that uses a polycrystalline silicon film.

In view of the above problems, the present invention intends to find a method of manufacturing a TFT substrate at low costs. That the number of steps is numerous is at the heart of the problem; accordingly, how to reduce the number of steps is considered. In order to reduce the indispensable steps in the manufacture of the TFT, it is necessary to reconsider a TFT structure itself and to reconstruct a manufacturing process thereof.

Accordingly, the invention intends to proposes a novel TFT structure and a novel process for manufacturing the novel TFT structure to largely reduce TFT manufacturing steps, and thereby to largely reduce the manufacturing cost of a TFT substrate. Furthermore, the invention intends to reduce a photolithography process and thereby to reduce the number of masks that are used in the TFT manufacturing process.

SUMMARY OF THE INVENTION

A reason that causes an increase in the TFT manufacturing steps is in that in order to make a gate interconnection and a source interconnection three-dimensionally intersect, a gate line and a source line, respectively have to be disposed under and above an interlayer insulating film. Furthermore, when, for instance, a source region and a source interconnection are connected, owing to the presence of the interlayer insulating film, a contact hole has to be opened. Accordingly, in order to form a novel structure that does not necessitate to open a contact hole, an island-like interlayer insulating film is deposited limited to a region where the source line and the gate line intersect. Furthermore, as needs arise, also in regions between an active layer and an interconnection, or the gate line and the source line, where holding capacity is formed, an island-like interlayer insulating film is formed. By constituting thus, largely different from a conventional TFT structure, a structure where an interlayer insulating film exists only in an intersection of a gate interconnection and a source interconnection and a holding capacity forming portion is obtained. By use of the novel TFT structure, a contact hole becomes unnecessary to form to a source/drain region and a gate interconnection.

As a method of forming an island-like interlayer insulating film, there is a liquid drop discharge method. By use of a liquid drop discharge method, a liquid containing an insulating material has only to be dropped in a region where a gate interconnection and a source interconnection intersect or a region where holding capacity is formed. As another method, by use of a CVD method, with a metal mask faced to a substrate, only in a region where a gate interconnection and a source interconnection intersect or a region where holding capacity is formed, an insulating film is formed.

In the case of a liquid drop discharge method being used as still another method, a gate interconnection, a gate electrode and a source interconnection can be formed sequentially. In order to sequentially form, three liquid drop discharge heads shown in FIG. 2 each of which has a linear solution discharge nozzle are used. Three liquid drop discharge heads are arranged to form one liquid drop discharge device. A head A201 discharges a metal paste, by scanning the head or a substrate, forms a gate electrode and a gate interconnection on predetermined positions. A head B202 discharges an insulating paste on predetermined positions, that is, a region where a gate interconnection and a source interconnection intersect and a region where holding capacity is formed. A head C203 discharges a metal paste on a predetermined position to form a source interconnection and at the same time connects a source/drain region and so on. Considering a curing time of the discharged paste, a discharge timing (scanning speed) of the paste is optimized.

Furthermore, by arranging four heads that discharge a liquid drop, a gate insulating film also can be sequentially formed. As to the head, instead of arranging a plurality of heads, a plurality of kinds of nozzles may be disposed to one head. Still furthermore, by use of a plurality of liquid drop discharge devices, separate treatments can be applied. At this time, calcining for each treatment is preferably applied.

In the case of a gate electrode, a gate interconnection and a source interconnection being sequentially formed according to the above method, a source region and a drain region are necessary to be doped beforehand with an impurity.

In the next place, a configuration of the above-explained invention will be described.

A semiconductor device in the invention is characterized in that a gate interconnection and a source interconnection formed on a substrate are disposed on the same plane, and in a region where the gate interconnection and the source interconnection intersect, the gate interconnection and the source interconnection intersect through an insulating film.

Furthermore, the gate interconnection and the source interconnection may intersect through an island-like insulating layer.

In the above configuration, the island-like insulating layer is disposed covering the gate interconnection and on an upper portion of the island-like insulating layer the source interconnection may be disposed, or the island-like insulating layer is disposed covering the source interconnection and on an upper portion of the island-like insulating layer the gate interconnection may be disposed. Furthermore, a source region and the source interconnection, not through a contact hole, may be connected on the same plane.

A semiconductor device according to the invention may have a capacitor with an island-like insulating layer as dielectrics.

Furthermore, in the above configuration according to the invention, a thin film transistor of a semiconductor device includes a semiconductor film including a channel formation region, and as the semiconductor film a microcrystalline semiconductor can be used. The microcrystalline semiconductor is a film including a semiconductor that has a structure intermediate between an amorphous and a crystalline structure (including single crystal and poly crystal). The microcrystalline semiconductor is a semiconductor that has a third state that is stable from a free energy point of view, crystalline one that has a short-range order and lattice distortion, and one that is allowed to exist dispersed in a non single crystalline semiconductor when a particle diameter thereof is in the range of 0.5 to 20 nm. In the microcrystalline semiconductor, a Raman spectrum thereof is shifted toward a lower frequency side than 520 $cm^{-1}$, and, in X-ray diffraction, diffraction peaks of (111) and (220) that are said owing to a Si crystal lattice are observed. Furthermore, hydrogen atoms or halogen atoms as a neutralizer of the dangling bonds are contained 1 atomic percent or more. For convenience sake, such a semiconductor is called a semi-amorphous semiconductor (SAS). Furthermore, when a rare gas element such as helium, argon, krypton or neon is contained and thereby the lattice distortion is further forwarded to increase the stability, an excellent semi-amorphous semiconductor can be obtained.

Furthermore, according to the invention, in the above configuration, as a semiconductor film, an organic material can be used. As the organic material, organic molecular crystals and organic polymer compound materials have only to be used. Specific organic molecular crystals include polycyclic aromatic compounds, conjugated double bond compounds, carotene, macro cyclic compounds or complexes thereof, phthalocyanine, charge transfer complexes, tetrathiofulvalene: TCNQ complexes, free radicals, diphenylpierylhydrazyl, dyes or proteins. Furthermore, specific organic polymer compound materials include polymers such as π-conjugated polymers, CT complexes, polyvinyl pyridine, and iodine or phthalocyanine metal complexes. In particular, π-conjugated polymers, the skeleton of which is formed of conjugate double bonds such as polyacetylene, polyaniline, polypyrrole, polythienylene, polythiophene derivatives, poly (3 alkylthiophene), polyparaphenylene derivatives or polyparaphenylene vinylene derivatives can be preferably used.

Furthermore, in the above configuration, as a thin film transistor, either one of an inversed stagger type and a forward stagger type may be used.

A manufacturing method according to the invention of a semiconductor device includes forming a gate interconnection; selectively forming an island-like insulating layer with the gate interconnection covered; forming a source interconnection on a same plane with the gate interconnection is formed; and, in a region where the gate interconnection and the source interconnection intersect, forming the gate interconnection and the source interconnection with these being intersected through an insulating layer.

Furthermore, as another manufacturing method, in the above configuration, a source interconnection is previously formed, and in a intersecting region a gate interconnection may be formed through an insulating film on the source interconnection.

Still furthermore, in the invention, in the above configuration, an interconnection, an insulating layer or a resist can be formed by use of a liquid drop discharge method. The liquid drop discharge method means a method in which a solution containing metal particles or a solution containing an insulating material is discharged to form a predetermined pattern, and an ink jet method and so on are included in the category. However, all steps of forming the interconnection, insulating layer or resist are not necessarily carried out by discharging a liquid drop. For instance, in such a manner that an insulating film and resist are formed by use of the liquid drop discharge method, and an interconnection pattern is formed with a photolithography method, the liquid drop discharge method can be at least partially used in the process, and a photolithography method also can be used together. Furthermore, a mask that is used at the patterning may be formed by use of the liquid drop discharge method.

Furthermore, in the invention, a gate interconnection and a source interconnection can be formed by use of, without restricting to the liquid drop discharge method, any method. For instance, after a pattern of a gate interconnection is formed according to the photolithography method, a source interconnection may be formed according to a liquid drop discharge method, or after a source interconnection is formed by means of the liquid drop discharge method, the gate interconnection may be formed by use of the photolithography method.

Other than the above, for instance, an interconnection may be formed by use of a laser drawing device. Specifically, a photosensitive material is formed by coating by use of a spin coat method or by discharging a liquid drop, a laser beam is irradiated on the photosensitive material formed followed by developing, and thereby a mask pattern is formed. Thereafter, with the mask pattern as a mask, an interconnection is formed. Either a negative photosensitive material or a positive photosensitive material can be used. Furthermore, the above method is not restricted to the formation of the interconnections, and a pattern of a semiconductor film or an insulating film may be formed according to the similar method.

The configuration according to the invention can be preferably applied in an atmosphere in the neighborhood of atmospheric pressure. A pressure in the neighborhood of atmospheric pressure means a pressure in the range of 600 to 106000 Pa; however, without restricting to the numeral values, a little bit positive pressure state due to a gas flow and so on is contained.

The abovementioned configurations according to the invention can be used in a manufacturing method of a semiconductor device and a display device.

A semiconductor device according to the specification denotes all devices that work by making use of the semiconductor characteristics, and can be particularly preferably made use of in an electro-optic device typical in a liquid crystal display device and an EL display device in which on one substrate an image display region and a driving circuit for carrying out image display are disposed, and an electronic device that mounts the electro-optic device. Furthermore, the semiconductor device includes the electro-optic device and the electronic device that mounts the electro-optic device in its category.

When a TFT structure that does not have an interlayer insulating film is adopted, a process can be largely simplified. Furthermore, a string of steps including forming a contact hole and establishing an electrical connection becomes unnecessary. Still furthermore, owing to a decrease in the number of manufacturing steps, material costs and personnel costs in the TFT manufacture decrease, resulting in realizing low costs. The number of devices becomes less and steps that use a vacuum can be largely reduced; accordingly, equipment investment becomes less. Furthermore, a manufacturing time period up to the completion of a TFT can be also largely shortened.

According to the configuration according to the invention, since apparatus can be easily enlarged, the present invention can be preferably applied to the manufacture of a semiconductor device such as a display device that uses a larger size substrate. Furthermore, since the number of steps is very small, yield can be improved.

DETAILED DESCRIPTION OF THE PRESENTLY PREFERRED EMBODIMENTS

Embodiment modes according to the invention are described in detail with reference to the drawings. It is easily understood by those who are in the art that embodiment modes and details herein disclosed can be modified in various ways without departing from the scope and spirit of the present invention. Therefore, it should be noted that the description of embodiment modes to be given below should not be interpreted as limiting the invention.

Embodiment Mode 1

Figure 1:
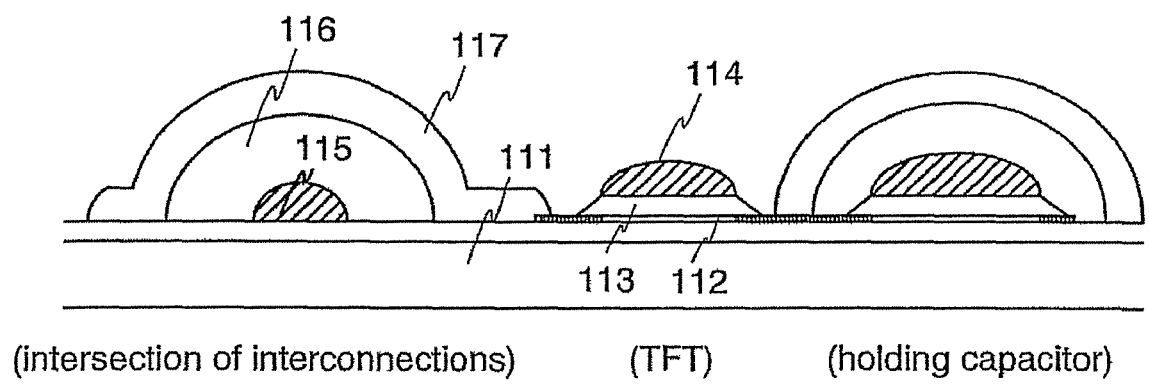
FIG. 1 is a diagram showing a TFT structure according to the present invention.
Figure 7:
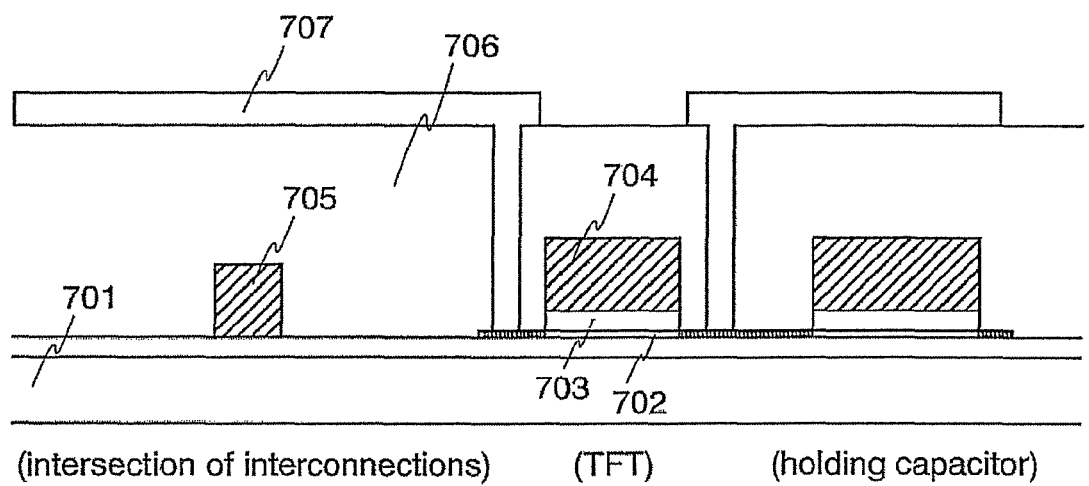
FIG. 7 is a diagram showing a conventional TFT structure.

With reference to FIG. 1 a specific method of manufacturing a TFT according to the invention will be explained. When a TFT structure according to the invention is adopted, in comparison with a conventional method shown in FIG. 7, the number of steps can be largely reduced.

1. Formation of active layer
2. Source/drain doping
3. Successive formation of gate insulating film, gate electrode and gate interconnection, source interconnection and holding capacity Firstly, on a substrate 111, an island-like semiconductor layer 112 that becomes an active layer is formed. The substrate 111 is made of various kinds of materials such as glass, quartz, semiconductor, plastics, plastics film, metal, glass epoxy resin and ceramics. A substrate made of a flexible synthetic resin such as plastics, though having general tendency to be low in the heat resistance temperature compared with glass and metal, as far as it can stand a processing temperature in a manufacturing process, can be used. Furthermore, a surface of the substrate 111 may be polished to planarize by use of a CMP method and so on.

The island-like semiconductor layer 112 is formed according to a procedure below. Firstly, on the substrate 111, a base film such as a silicon oxide film or silicon nitride film is deposited, followed by depositing thereon a semiconductor layer having an amorphous structure. The semiconductor layer, by use of a plasma CVD method or a sputtering method, is deposited into a thickness in the range of 20 to 150 nm, preferably in the range of 30 to 80 nm. As the semiconductor layer having an amorphous structure, an amorphous semiconductor film and a semi-amorphous semiconductor film (SAS) can be cited. A compound semiconductor film having an amorphous structure such as an amorphous silicon germanium film may be applied.

An amorphous semiconductor can be obtained by glow discharge decomposition of a silicide gas. As typical silicide gases, $SiH_4$ and $Si_2H_6$ can be cited. The silicide gas may be diluted with hydrogen, or hydrogen and helium to use.

Furthermore, the semi-amorphous semiconductor as well can be obtained by glow discharge decomposition of a silicide gas. As a typical silicide gas, $SiH_4$ can be cited. Other than this, $Si_2H_6$, $SiH_2Cl_2$, $SiHCl_3$, $SiCl_4$ and $SiF_4$ and the like can be used. Still furthermore, when the silicide gas is diluted with hydrogen or a gas obtained by mixing hydrogen and at least one kind of rare gas element selected from helium, argon, krypton and neon, a semi-amorphous semiconductor can be easily formed. The silicide gas is preferably diluted at a dilution ratio in the range of 2 to 1000 times. Furthermore, the silicide gas may be blended with a carbide gas such as $CH_4$ or $C_2H_6$, a germanium compound gas such as $GeH_4$ or $GeF_4$, or $F_2$ to control an energy bandwidth to 1.5 to 2.4 eV, or 0.9 to 1.1 eV. In a TFT where the SAS is used as a first semiconductor film, the mobility in the range of 1 to 10 $cm^2/Vsec$ or more than that can be obtained.

A reaction formation of a film owing to glow discharge decomposition can be carried out under reduced pressure or atmospheric pressure. When it is carried out under reduced pressure, pressure substantially in the range of 0.1 to 133 Pa can be applied. As electric power necessary for glow discharge, high-frequency electric power in the range of 1 MHz to 120 MHz, preferably in the range of 13 MHz to 60 MHz has to be supplied. The pressure is set in the range of substantially 0.1 to 133 Pa and a power source frequency is set in the range of 1 MHz to 120 MHz, preferably in the range of 13 to 60 MHz. A substrate heating temperature may be 300 degree centigrade or less, preferably in the range of 100 to 250 degree centigrade. As impurity elements in the film, atmospheric impurities such as oxygen, nitrogen and carbon are desirably $1\times10^{20}$ atoms/$cm^3$ or less, in particular, an oxygen concentration is $5\times10^{19}$ atoms/$cm^3$ or less, preferably $1\times10^{19}$ atoms/$cm^3$ or less.

In the next place, a semiconductor layer having an amorphous structure is crystallized by use of a laser annealing method, a thermal annealing method or a rapid thermal annealing method (RTA method) and the like. According to a technique disclosed in Japanese Patent Laid-open No. Hei 07-130652, the crystallization may be carried out by use of a crystallization method with metal element Ni. Subsequently, with a resist mask, a crystalline semiconductor layer undergone the crystallization is selectively etched, and thereby an island-like semiconductor layer 112 is formed in a predetermined region.

When a resist mask is formed in a predetermined region, usually, a photolithography step is used; however, a liquid drop discharge method may be used. At this time, an island-like semiconductor layer close to a shape of an ellipse is formed. In the case of the liquid drop discharge method being used, as a mask pattern material, a photosensitive material is not necessarily used, and a material that can be easily removed has to be selected. Furthermore, when the liquid drop discharge method is used, a step of exposure, development and the like can be omitted. Still furthermore, a material used can be reduced to the minimum necessary; accordingly, the usability of the material can be improved.

Subsequently, on an entire surface of the island-like semiconductor layer 112, B (boron) is added at a concentration of $1\times10^{16}$ to $5\times10^{17}$/$cm^3$ to control a threshold voltage. The addition of B may be carried out before the island-like semiconductor layer 112 is formed. Furthermore, as needs arise, in some cases, an impurity element such as P (phosphorus) may be added to impart the n-type, or a threshold of a p-channel type TFT may be controlled. On the occasion of adding an impurity element, a method that carries out mass separation such as an ion implantation method, an ion shower doping method or a plasma doping method can be used.

Figure 8:
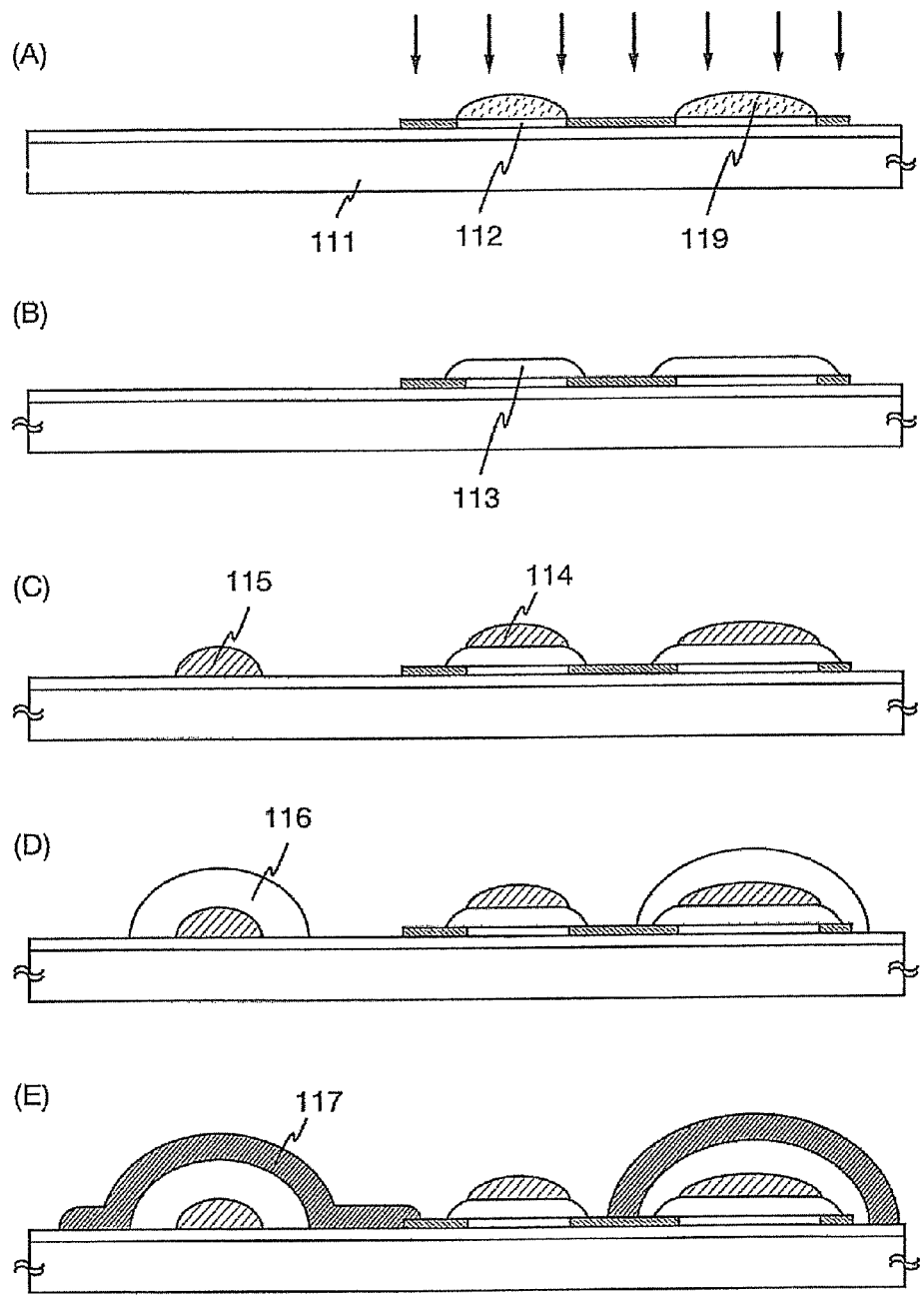
FIGS. 8A-E are diagrams showing a TFT structure according to the invention.

In the next place, an impurity element that imparts the n-type is doped in a predetermined region to form a source region and a drain region of an n-channel type TFT (FIG. 8A). In the case of a source region and a drain region of a p-channel type TFT being formed, impurity atoms that impart the p-type are doped. When by use of the photolithography method or the liquid drop discharge method a mask 119 is disposed over an entire surface of the island-like semiconductor region or in a channel formation region, doping regions can be separated. According to the doping process, an impurity concentration in the source/drain region is made in the range of $1\times10^{20}$ to $5\times10^{21}$/$cm^3$.

In the next place, by means of an ashing method, a dry etching method, or a wet etching method, a doped mask 119 is removed, thereafter by use of a laser annealing method, a furnace method or an RTA method, a doped impurity element is activated, and thereby the sheet resistance of the source/drain region is made at 10 kΩ/□ or less. The activation can be applied after a gate line and interconnections are formed. When the doping and doped mask steps are used twice, an LDD region and a gate overlap region also can be formed.

Figure 2:
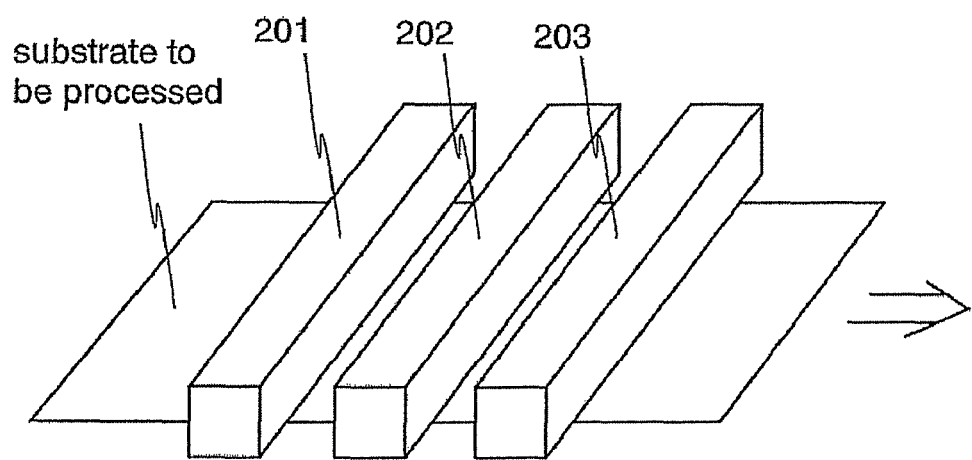
FIG. 2 is a diagram showing a configuration of a device provided with a head for discharging a plurality of liquid drops.

After the source/drain region is formed, a plurality of kinds of heads each of which discharges a liquid drop is arranged and scanned, and thereby a gate insulating film 113, a gate electrode 114 and a gate interconnection 115, an insulating layer 116 and a source interconnection 117 are successively formed. The successive formation is carried out by use of a liquid drop discharge device provided with a head configuration shown in FIG. 2.

Firstly, in a nozzle in a front row relative to a substrate scanning direction of the liquid drop discharge device an insulating solution is guided, the solution is discharged in accordance with a predetermined electric signal, and thereby a gate insulating film 113 is formed (FIG. 8B). The insulating film is necessarily formed so as to cover an entire surface in a channel region and partially leave a naked portion in the source/drain region.

Subsequently, a solution containing metal particles is introduced in a nozzle in a second row and discharged on predetermined positions to form a gate electrode 114 and a gate interconnection 115 (FIG. 8C). As the solution that contains metal particles, independently dispersed nano particles (particle diameter: 2 to 10 nm) that are dispersed without coagulating in a solvent can be preferably used. In the next place, in a nozzle in a third row an insulating solution is introduced followed by discharging in drop only in a region where the gate interconnection 115 and the source interconnection 117 intersect and on a holding capacity formation portion, and thereby the insulating layer 116 is formed (FIG. 8D).

In the last, a solution containing metal particles (preferably independently dispersed nano particles of gold, silver or copper) is introduced in a nozzle in a fourth row followed by discharging on a predetermined position, and thereby the source interconnection 117 is formed (FIG. 8E). At this time, the source region and the source interconnection 117, without going through a contact hole, are directly electrically connected. Furthermore, the gate interconnection 115 and the source interconnection 117 intersect three-dimensionally through the insulating layer 116, without being electrically connected.

On the occasion of a liquid drop being dropped to form an interconnection, a conductive material having at least one of metals such as Ag, Au, Cu and Pd and metal compounds is used. When a dispersant can be used to suppress coagulation from occurring and thereby to disperse in a solution, a conductive material having at least one of meals such as Cr, Mo, Ti, Ta, W and Al and metal compounds can be used. Furthermore, when, by use of a liquid drop discharge method or various kinds of printing methods, a conductive material is coated a plurality of times, a gate electrode in which a plurality of conductive films is laminated can be formed. However, as a composition that is discharged from a delivery, one in which, by taking into consideration a specific resistivity value, any one of Au, Ag and Cu is dissolved or dispersed in a solvent can be preferably used, more preferably Ag or Cu low in the resistance can be used. However, in the case of Ag or Cu being used, as a countermeasure against impurities, a barrier film may be disposed in combination. As the barrier film, a silicon nitride film or nickel boron (NiB) can be used. Furthermore, other than the metal particles, a solution containing a metal element such as a metal alkoxide that is mainly used in the sol-gel method can be discharged to form an interconnection.

A diameter of a nozzle that is used in the discharge of a liquid drop is set in the range of 0.1 to 50 μm (preferably in the range of 0.6 to 26 μm), and an amount of a composition discharged from the nozzle is set in the range of 0.00001 to 50 pl (preferably in the range of 0.0001 to 40 pl). The discharge amount increases in proportional to a magnitude of a diameter of the nozzle. Furthermore, a distance between a subject to be processed and the delivery of the nozzle, in order to drop on a desired position, is preferably made as small as possible, more preferably set in the range of substantially 0.1 to 2 mm. Without varying the nozzle diameter, a pulse voltage applied on a piezoelectric element is varied and thereby a discharge amount can be controlled. These discharge conditions are preferably set so that a line width may be substantially 10 μm or less.

In the next place, heat treatment is applied at a temperature between 150 and 400 degree centigrade for 10 to 60 min, and thereby an electrode and an interconnection metal are calcined. At this time, when the heat treatment is carried out in a state where a thin film is formed with much nitrogen contained, the hydrogenation can be simultaneously carried out.

Thereafter, a drain interconnection is connected to pixel electrodes corresponding to various kinds of elements such as a light-emitting element or a liquid crystal element, followed by forming a protective film over an entire surface, and thereby a TFT substrate comes to completion. The protective film also may be formed by use of the liquid drop discharge method.

For the protective film, polyimide, acryl, polyamide, polyimideamide or BCB (benzocyclobuthene) and the like having a thickness of 1.0 to 1.5 μm can be used. Thus, an active matrix substrate having a driving circuit and a pixel portion on the same substrate can be manufactured.

Embodiment Mode 2

On the occasion of manufacturing a semiconductor device with a substrate having the translucency in the present embodiment mode according to the invention, as a size of substrate, a large size substrate such as 600 mm×720 mm, 680 mm×880 mm, 1000 mm×1200 mm, 1100 mm×1250 mm, 1150 mm×1300 mm, 1500 mm×1800 mm, 1800 mm×2000 mm, 2000 mm×2100 mm, 2200 mm×2600 mm, or 2600 mm×3100 mm is used.

When such a large size substrate is used, the manufacturing cost can be reduced. As the substrates that can be used, substrates made of glass such as barium borosilicate glass or aluminoborosilicate glass typical in Corning #7059 glass and #1737 glass can be used. Furthermore, as other substrates, various kinds of translucent substrates such as quartz, semiconductor, plastics, plastics film, metal, glass epoxy resin, and ceramics can be used as well.

Embodiment Mode 3

An example of a liquid drop discharge device that is used for carrying out the embodiment mode will be explained with reference to FIGS. 3 to 5.

Figure 3:
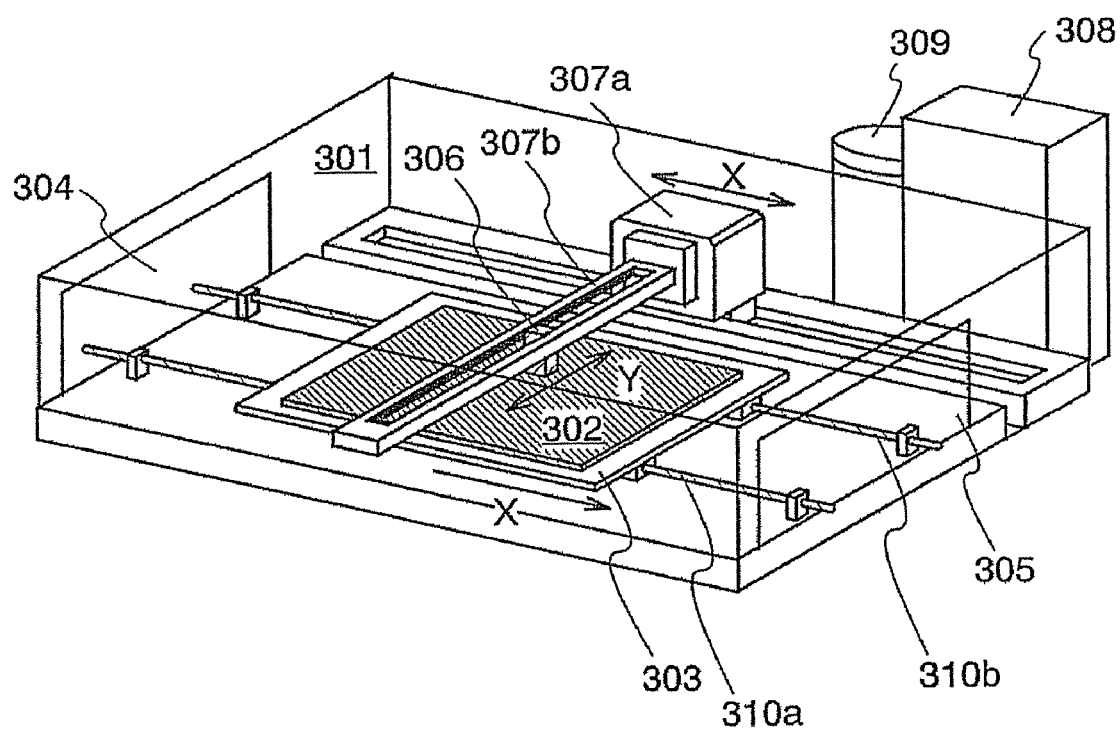
FIG. 3 is a diagram showing one example of a liquid drop discharge device that is used when the invention is carried out.

A liquid drop discharge device shown in FIG. 3 has a liquid drop discharge means 306 in the device, by use of which a solution is discharged, and thereby a desired pattern is obtained on a substrate 302. In the liquid drop discharge device, as the substrate 302, other than a glass substrate having a desired size, subjects to be processed such as a resinous substrate typical in a plastics substrate or a semiconductor wafer typical in silicon can be used.

In FIG. 3, the substrate 302 is carried from an inlet port 304 into a chassis 301, and a substrate undergone a liquid drop discharge step is carried out of an outlet port 305. Inside of the chassis 301, the substrate 302 is mounted on a transfer table 303 and the transfer table 303 moves on rails 310a and 310b that connect between the inlet port and the outlet port.

Supports 307a and 307b of the liquid drop discharge means support liquid drop discharge means 306 that discharge a solution and move the liquid drop discharge means 306 to an arbitrary position in a X-Y plane. The support 307a of the liquid drop discharge means move in an X-direction that is in parallel with the transfer table 303 and liquid drop discharge means 306 mounted on the support 307b of the liquid drop discharge means fixed to the support 307a of the liquid drop discharge means move in a Y-direction that is vertical to an X-direction. When the substrate 302 is carried into the chassis 301, at the same time therewith, the support 307a of the liquid drop discharge means and the liquid drop discharge means 306 move in X and Y directions, respectively, to be set at predetermined initial positions for carrying out liquid drop discharge step. The movement of the support 307a of the liquid drop discharge means and the liquid drop discharge means 306 toward an initial position, when carried out at the time of carrying in or carrying out the substrate, enables to effectively discharge a liquid drop.

The liquid drop discharge step starts when the substrate 302 reaches, owing to a movement of the transfer table 303, a predetermined position where the liquid drop discharge means 306 wait. The liquid drop discharge step is achieved by a combination of a relative movement of the support 307a of the liquid drop discharge means, the liquid drop discharge means 306 and the substrate 302 and liquid drop discharge from the liquid drop discharge means 306 supported by the support of the liquid drop discharge means. When movement speeds of the substrate, the support of the liquid drop discharge means and liquid drop discharge means, and a period of discharging a solution from the liquid drop discharge means 306 are controlled, a desired pattern can be drawn on the substrate 302. In particular, since high precision is necessary for the liquid drop discharge step, it is desirable that at the time of discharge, with the movement of the transfer table stopped, only the support 307a of the liquid drop discharge means and the liquid drop discharge means 306b high in the controllability are scanned. Furthermore, the respective scanning in an X-Y direction of the liquid drop discharge means 306 and the support 307a of the liquid drop discharge means, without restricting to one direction, may be reciprocated or repeated to reciprocate to carry out the liquid drop discharge step.

A solution is supplied from a solution feeder 309 disposed outside of the chassis 301 into the chassis, further through the supports 307a and 307b of the liquid drop discharge means to a liquid chamber inside of the liquid drop discharge means 306. Feed of the solution is controlled by control means 308 disposed outside of the chassis 301; however, it may be controlled with control means that are incorporated in the support 307a of the liquid drop discharge means inside of the chassis.

Furthermore, the movement of the transfer table and the support of the liquid drop discharge means is controlled similarly with the control means 308 disposed outside of the chassis 301.

Though not shown in FIG. 3, a sensor for aligning to a substrate or a pattern on the substrate, means for introducing a gas into the chassis, means for exhausting the inside of the chassis, means for heating the substrate, means for irradiating light on the substrate, in addition, means for measuring values of various physical properties such as temperature and pressure may be disposed as needs arise. Furthermore, these means as well can be controlled in one lump with the control means 308 disposed outside of the chassis 301. Furthermore, when the control means 308 are connected through a LAN cable, a wireless LAN or an optical fiber to a production control system or the like, the process can be controlled without exception from the outside, and thereby the productivity can be improved.

In the next place, an inside structure of the liquid drop discharge means 306 will be explained. FIG. 4 shows a cross section in parallel with a Y-direction of the liquid drop discharge means 306 shown in FIG. 3.

A solution that is externally supplied inside of the liquid drop discharge means 306 goes through a liquid chamber flow path 402 and, after reserved in a preparatory liquid chamber 403, moves toward a nozzle 409 for discharging the solution. A nozzle portion includes a fluid resistance portion 404 disposed for filling a proper solution in the nozzle, a pressurization chamber 405 for pressurizing the solution to discharge outside of the nozzle, and a liquid drop delivery 407.

On a sidewall of a pressurization chamber 405, a piezoelectric element 406 that has the piezoelectric effect such as lead titanate zirconate ($Pb(Zr, Ti)O_3$) that deforms owing to an application of a voltage is disposed. Accordingly, an application of a voltage on a piezoelectric element 406 disposed to a targeted nozzle enables to extrude a solution in the pressurization chamber 405 and thereby to externally discharge a solution 408.

According to the invention, a liquid drop is discharged according to a piezoelectric method that makes use of a piezoelectric element; however, depending on a material of the solution, a so-called thermal liquid drop discharge method in which a heater is heated to generate air bubbles, and the generated air bubbles extrude a solution may be used. In this case, the piezoelectric element 406 is replaced with the heater.

In the nozzle portion 409 for discharging a liquid drop, the wettability between a solution, and a liquid chamber path 402, a preparatory liquid chamber 403, a fluid resistance portion 404, a pressurization chamber 405 and a liquid drop delivery 407 becomes important. Accordingly, a carbon film or a resinous film for controlling the wettability with a material may be formed in a flow path.

According to the above means, a solution can be discharged on a substrate. As the liquid drop discharge method, there are a so-called sequential method in which a solution is continuously discharged to form a continuous linear pattern and a so-called on-demand method where a solution is discharged in dot. In a device configuration according to the invention, the on-demand method is shown; however, liquid drop discharge means according to the sequential method also can be used.

Figure 4:
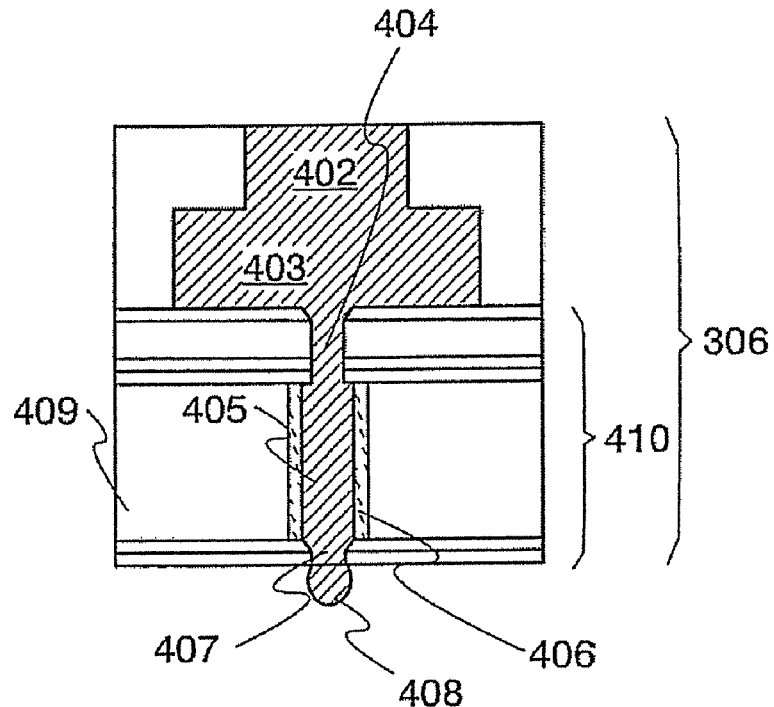
FIG. 4 is a diagram showing one example of a head that discharges a liquid drop and is used when the invention is carried out.
Figure 5:
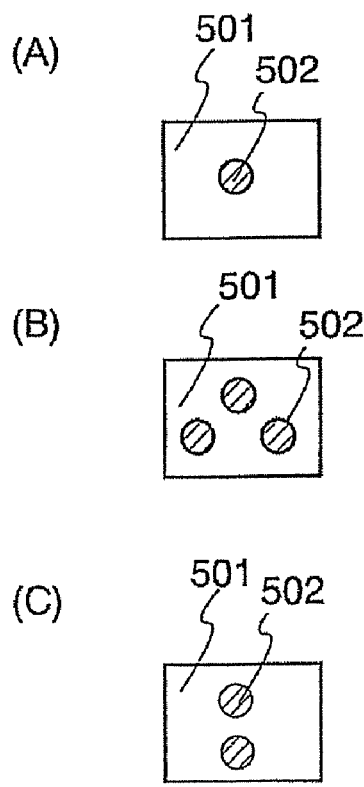
FIG. 5 is a diagram showing one example of a head that discharges a liquid drop and is used when the invention is carried out.

FIGS. 5A through 5C each are diagrams schematically showing a bottom portion of the liquid drop discharge means in FIG. 4. In FIG. 5A, a fundamental disposition in which one liquid drop delivery port 502 is disposed to the bottom of the liquid drop discharge means 501 is shown. On the other hand, in FIG. 5B, a so-called cluster disposition in which the number of the liquid drop delivery port 502 on the bottom of the liquid drop discharge means 501 is increased to three so as to form a triangle is shown. Furthermore, in FIG. 5C, liquid drop discharge deliveries are arranged above and below. In this arrangement, after a liquid drop is discharged from an upper liquid drop delivery port 502, with a time difference, a similar solution is discharged from a lower liquid drop delivery port 502 on the similar position, thereby before a solution that has been discharged on the substrate is dried or solidified, the same solution can be further coated thicker. Furthermore, when an upper liquid drop delivery port is clogged owing to the solution or the like, the lower liquid drop delivery port can be functioned as a preparatory one.

According to the embodiment mode, a configuration in which the liquid drop discharge means 306 are scanned in a Y-direction is shown; however, without restricting to this, liquid drop discharge means can be disposed in line in a Y-direction to discharge a solution. In this case, the liquid drop discharge means are not necessary to be scanned in a Y-direction but by scanning in an X-direction the solution can be discharged on an entire surface.

When a coating is selectively formed according to the liquid drop discharge means, an amount of the coating (resist, metal, semiconductor film and organic film) and the like almost of which has been made useless can be reduced, and thereby the manufacturing cost can be reduced.

Embodiment Mode 4

In the present embodiment mode, in order to form an interconnection pattern, a composition in which fine metal particles are dispersed in an organic solvent is used. An average particle diameter of the fine metal particles is in the range of 1 to 50 nm, preferably in the range of 3 to 7 nm. Typically, these are fine particles of silver or gold, and ones a surface of which is covered with a dispersant such as amine, alcohol, or thiol. As the organic solvent, phenol resins or epoxy resins of thermosetting or photosetting property are applied. In controlling the viscosity of the composition, a thixotropic agent or a diluent solvent may be added.

A composition discharged in a proper amount on a surface of a subject to be processed by use of the liquid drop discharge means solidifies an organic solvent owing to heating or photo-irradiation. Owing to a volume contraction resulting from the hardening of the organic solvent, fine metal particles are brought into contact with each other, and are expedited in blending, fusing or aggregation. That is, fine metal particles having an average particle diameter in the range of 1 to 50 nm, preferably in the range of 3 to 7 nm are blended, fused or aggregated to form an interconnection. Thus, when fine metal particles each other are blended, fused or aggregated to come into contact through surface, lower resistance of the interconnection can be realized.

In the invention, an interconnection pattern is formed by use of a composition like this, and thereby an interconnection pattern having a line width of substantially 1 to 10 μm can be easily formed.

When, instead of the fine metal particles, fine particles of an insulating material are used, similarly an insulating pattern can be formed.

The present embodiment mode can be freely combined with the abovementioned embodiment modes.

Embodiment Mode 5

In the present embodiment, a method of manufacturing an inversed stagger type semiconductor device that is different from one shown in embodiment mode 1 will be explained.

Figure 9:
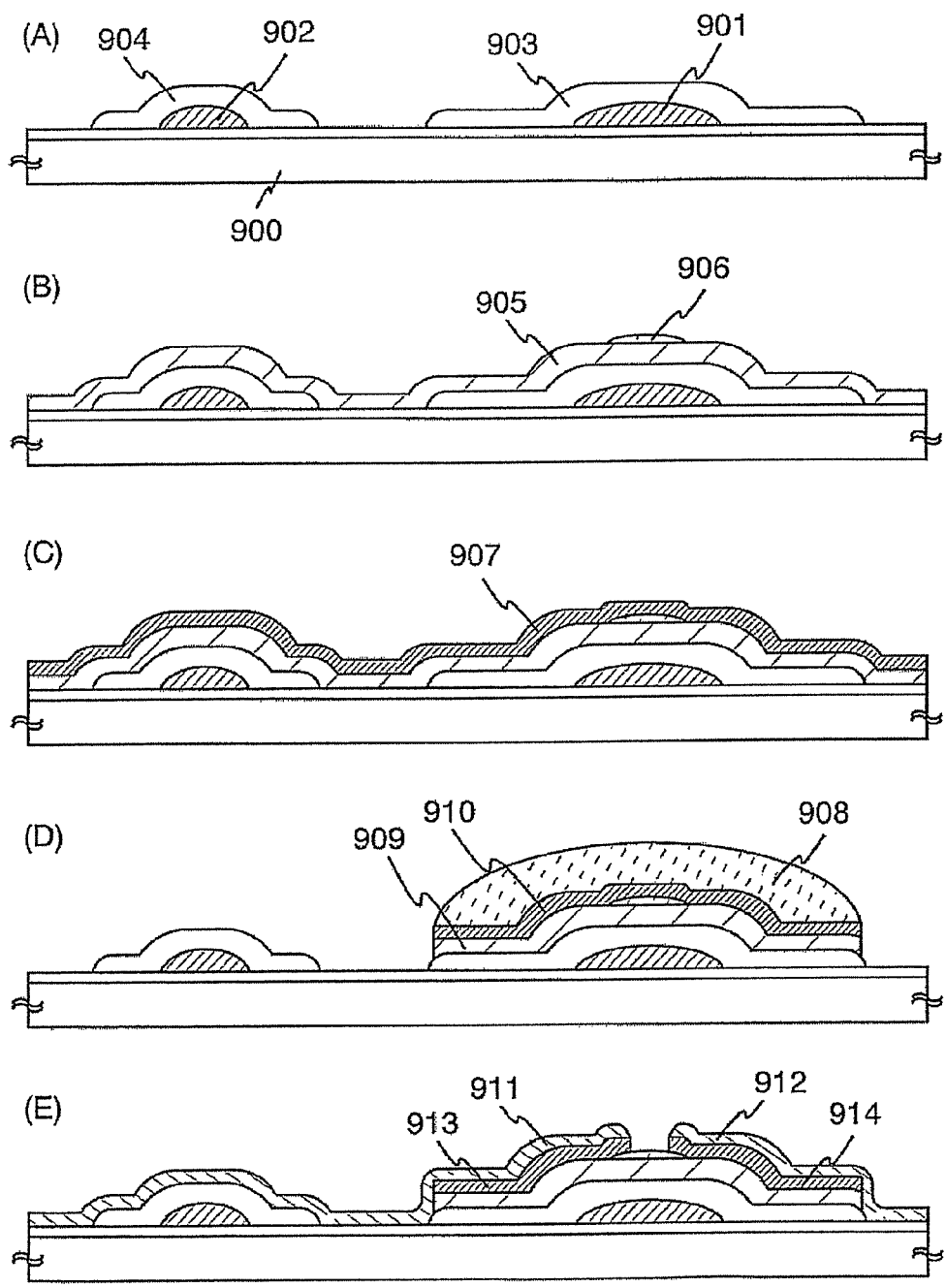
FIGS. 9A-9E are diagrams showing a TFT structure according to the invention.

Firstly, as shown in FIG. 9A, a substrate 900 on which TFTs and light-emitting elements are formed is formed. Specifically, as the substrate 900, a substrate of glass such as barium borosilicate glass or aluminoborosilicate glass, a quartz substrate or a ceramics substrate can be used. Furthermore, one in which on a surface of a metal substrate or a semiconductor substrate an insulating film is formed can be used. A substrate made of a flexible synthetic resin such as plastics, though having general tendency to be low in the heat resistance temperature compared with the above substrates, as far as it can stand a processing temperature in a manufacturing process, can be used. A surface of the substrate 900 may be polished by use of a CMP method and so on to planarize.

On a surface of the above substrate 900, in order to heighten the adhesiveness of a conductive film or an insulating film that is formed by use of the liquid drop discharge method, pretreatment is applied. As a method of improving the adhesiveness, a method in which a metal or a metal compound that can improve the adhesiveness owing to, for instance, a catalysis action is adhered on a surface of the substrate 900, a method of adhering an organic insulating film, a metal or a metal compound that is high in the adhesiveness with a conductive film or an insulating film that is to be formed to the substrate 900, or a method in which plasma treatment is applied under atmospheric pressure or reduced pressure on a surface of the substrate 900 to apply surface modification can be cited. Furthermore, as metals high in the adhesiveness with the conductive film or the insulating film, other than titanium and titanium oxide, 3d transition metals such as Sc, Ti, V, Cr, Mn, Fe, Co, Ni, Cu and Zn can be cited. As the metal compounds, an insulating film containing a Si—O—Si bond that is formed with, for instance, polyimide and siloxane base material as a starting material (hereinafter, referred to as siloxane base insulating film) and so on can be cited. The siloxane base insulating film may have, in a substituent group, other than hydrogen, at least one kind of fluorine, an alkyl group or an aromatic hydrocarbon.

In the case of a metal or a metal compound that is to be adhered to the substrate 900 having the conductivity, in order that a normal operation of a semiconductor element may not be disturbed, the sheet resistance thereof is controlled. Specifically, an average thickness of the metal or metal compound that has the conductivity is controlled so as to be for instance in the range of 1 to 10 nm, or the metal or metal compound is oxidized so as to be partially or totally insulative. Alternatively, other than a region where the adhesiveness is necessary to be heightened, the adhered metal or metal compound may be selectively removed by means of the etching. Furthermore, the metal or metal compound, not adhering beforehand over an entire surface of the substrate, may be adhered selectively only to a particular region by use of a liquid drop discharge method, a printing method or a sol-gel method. The metal or metal compound is not necessarily a completely continuous film on a surface of the substrate 900 or may be in a dispersed state to some extent.

In the embodiment mode, a photocatalyst such as ZnO or $TiO_2$ that can heighten the adhesiveness owing to a photocatalyst reaction is adhered on a surface of the substrate 900. Specifically, ZnO or $TiO_2$ is dispersed in a solvent and sprayed on a surface of the substrate 900, or a compound of Zn or a compound of Ti, after adhering on a surface of the substrate 900, is oxidized, or a sol-gel method is used, resultantly ZnO or $TiO_2$ can be adhered on a surface of the substrate 900.

In the next place, on a surface of the substrate 900 on which pretreatment is applied to heighten the adhesiveness, by use of a liquid drop discharge method or various kinds of printing methods, a gate electrode 901 and an interconnection 902 are formed. Specifically, for the gate electrode 901 and the interconnection 902, a conductive material having at least one of metals such as Ag, Au, Cu and Pd and metal compounds thereof is used. When a dispersant can suppress from aggregating and disperse in a solvent, a conductive material having at least one of metals such as Cr, Mo, Ti, Ta, W and Al and metal compounds can be used. Furthermore, when the coating of the conductive material is repeated a plurality of times by use of the liquid drop discharge method or various kinds of printing methods, a gate electrode in which a plurality of conductive films is laminated can be also formed. However, as a composition discharged from a delivery port, taking the specific resistivity value into consideration, one in which any one of Au, Ag and Cu is dissolved or dispersed in a solvent can be preferably used, more preferably Ag or Cu low in the resistance may be used. However, in the case of Ag or Cu being used, as a countermeasure against impurities, a barrier film can be preferably used together. As the barrier film, a silicon nitride film or nickel boron (NiB) can be used.

Subsequently, insulating films 903 and 904 are formed so as to cover the gate electrode 901 and interconnection 902 (FIG. 9A). The insulating films 903 and 904 can be formed by selectively discharging an insulative solution. As a method of forming an insulating film, without restricting to the above, a plasma CVD method or a sputtering method can be used to form an insulating film. Furthermore, the insulating film may be a single layer or a plurality of insulating films may be laminated.

In the next place, as shown in FIG. 9B, a first semiconductor film 905 is formed. The first semiconductor film 905 can be formed of an amorphous semiconductor or a semi-amorphous semiconductor (SAS). A polycrystalline semiconductor film also can be used. In the embodiment mode, as the first semiconductor film 905, the semi-amorphous semiconductor is used. The semi-amorphous semiconductor, being high in the crystallinity than the amorphous semiconductor, can obtain higher mobility than that, and, different from the polycrystalline semiconductor, can be formed without increasing a process for crystallization.

Subsequently, so as to overlap with, of the first semiconductor film 905, a portion that becomes a channel formation region, a protective film 906 is formed on the first semiconductor film 905. The protective film 906 may be formed by use of a liquid drop discharge method or may be formed by use of a CVD method or a sputtering method. As the protective film 906, an inorganic insulating film made of such as silicon oxide, silicon nitride, or silicon nitride oxide or a siloxane base insulating film can be used. Furthermore, these films may be laminated to form a protective film 906. In the embodiment mode, silicon nitride formed by use of a plasma CVD method and a siloxane base insulating film formed according to a liquid drop discharge method are laminated and used as a protective film 906. In this case, silicon nitride can be patterned by use of a siloxane base insulating film formed according to the liquid drop discharge method as a mask.

Then, so as to cover the first semiconductor film 905, a second semiconductor film 907 is formed (FIG. 9C). To the second semiconductor film 907, an impurity that imparts one conductivity type has been added. In the case of a p-channel type TFT being formed, as an impurity that imparts the p-type, an impurity gas such as $B_2H_6$ or $BF_3$ may be blended with a silicide gas. For instance, in the case of boron being used as an impurity that imparts the p-type, a concentration of boron may be set in the range of $1\times10^{14}$ to $6\times10^{16}$ atoms/cm$^3$. Furthermore, in the case of an n-type TFT being formed, to the second semiconductor film 907, an impurity that imparts the n-conductivity type, for instance, phosphorus, may be added. Specifically, an impurity gas such as $PH_3$ is added to a silicide gas and therewith a second semiconductor film 907 may be formed. The second semiconductor film 907 having one conductivity type, similarly to the first semiconductor film 905, can be formed of a semi-amorphous semiconductor or an amorphous semiconductor.

In the next place, by use of a resist 908 formed by means of the liquid drop discharge method as a mask, the first and second semiconductor films 905 and 907 are patterned (FIG. 9D). In FIG. 9D, reference numerals 909 and 910, respectively, correspond to the patterned first semiconductor film and patterned second semiconductor film. In this case, as a mask pattern material, a photosensitive material is not necessarily used but a material that can be easily removed may be selected.

After the resist 908 is removed, a liquid drop discharge method source interconnection 911 and a liquid drop discharge method drain interconnection 912 are formed. Then with the source interconnection 911 and the drain interconnection 912 as the mask, the second semiconductor film 910 is further patterned to form second semiconductor films 913 and 914 that function as a source region or a drain region. Thereafter, the drain interconnections are connected to pixel electrodes corresponding to various kinds of elements such as light-emitting elements or liquid crystal elements followed by forming a protective film over an entire surface, and thereby a TFT substrate comes to completion.

In the case of a semiconductor device that has a pixel portion formed according to the embodiment mode, when a semi-amorphous semiconductor is used as a first semiconductor film, a scanning line driving circuit can be formed on a substrate same as that of the pixel portion. Furthermore, a pixel portion may be formed from TFTs in which an amorphous semiconductor is used and on a substrate on which the pixel portion is formed a separately prepared driving circuit may be attached.

Embodiment Mode 6

Figure 6:
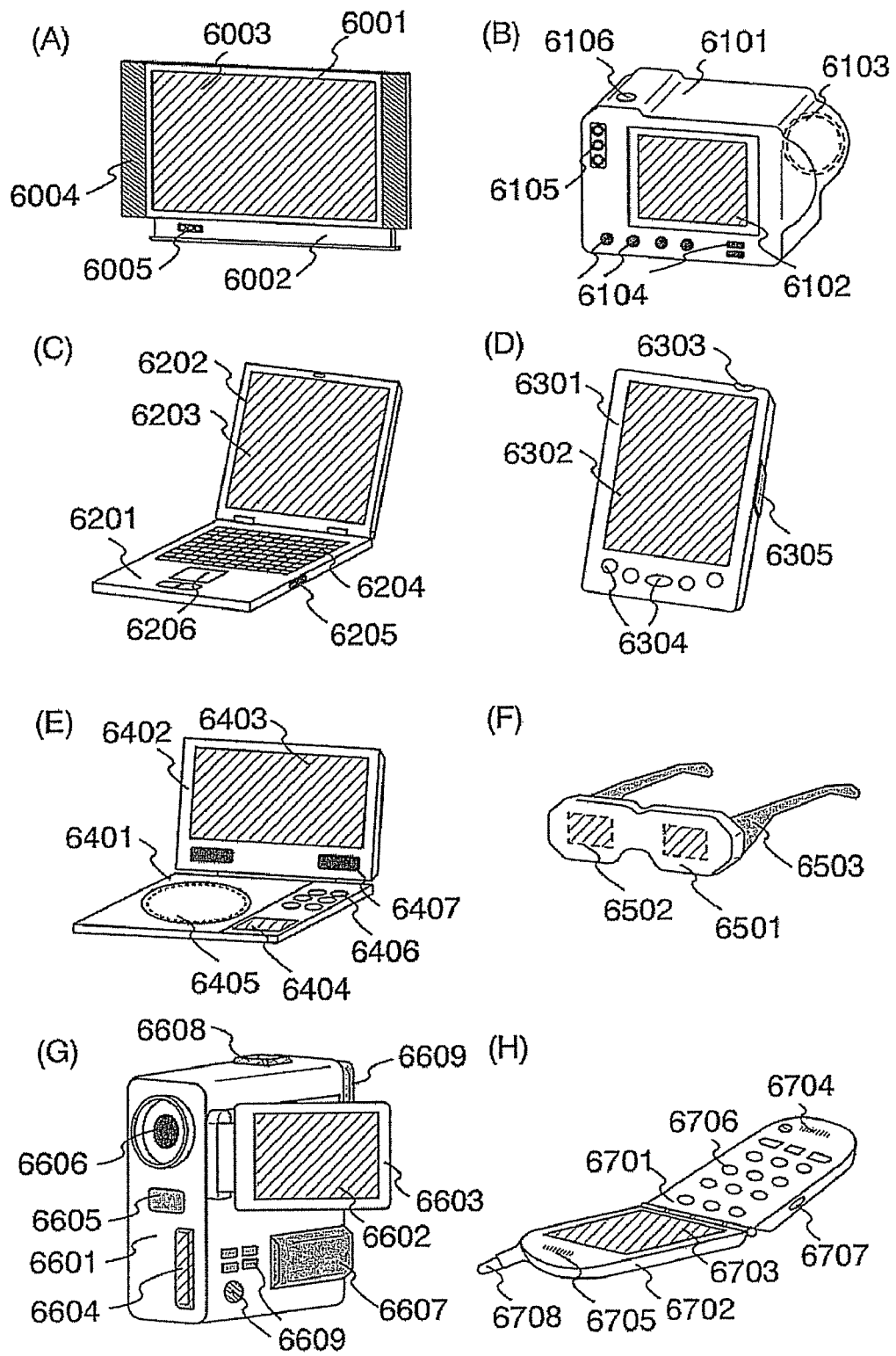
FIGS. 6A-6G are diagrams showing examples of electronic devices.

In the next place, as electronic devices that use the invention, a video camera, a digital camera, a goggle type display (head-mount display), a navigation system, an audio reproducing system (such as a car audio system and an audio compo system), a note type personal computer, a game machine, a personal digital assistant (such as a mobile computer, a portable telephone, a portable game machine or an electronic book), and an image reproducing system with a recording medium (specifically, a device that can reproduce a recording medium such as a DVD (Digital Versatile Disc) and is provided with a display that can display an image thereof) can be cited. Specific examples of the electronic devices are shown in FIG. 6.

FIG. 6A shows a display device that includes a chassis 6001, a support table 6002, a display portion 6003, a speaker portion 6004, and a video input terminal 6005 and the like. The present invention can be applied to an electric circuit that constitutes the display portion 6003. Furthermore, according to the invention, the display device shown in FIG. 6A comes to completion. The display device includes all display devices for information display such as for a personal computer, a 20 to 80 inch TV broadcasting receiver and a billboard.

FIG. 6B shows a digital still camera that includes a main body 6101, a display portion 6102, a receiver 6103, an operation key 6104, an external connecting port 6105 and a shutter 6106 and the like. The invention can be applied to an electric circuit that constitutes the display portion 6102. Furthermore, according to the invention, the digital still camera shown in FIG. 6B comes to completion.

FIG. 6C shows a note type personal computer that includes a main body 6201, a chassis 6202, a display portion 6203, a key board 6204, an external connecting port 6205 and a pointing mouse 6206 and the like. The invention can be applied to an electric circuit that constitutes the display portion 6203. According to the invention, the note type personal computer shown in FIG. 6C comes to completion.

FIG. 6D shows a mobile computer that includes a main body 6301, a display portion 6302, a switch 6303, an operation key 6304, and an infrared port 6305 and the like. The invention can be applied to an electric circuit that constitutes the display portion 6302. According to the invention, the mobile computer shown in FIG. 6D comes to completion.

FIG. 6E shows a portable image reproducing system (specifically, a DVD reproducing system) with a recording medium that includes a main body 6401, a chassis 6402, a display portion A 6403, a display portion B 6404, a reading portion of a recording medium (such as a DVD) 6405, an operation key 6406, and a speaker portion 6407 and the like. The display portion A 6403 mainly displays image information and the display portion B 6404 mainly displays literature information. The invention can be applied to electric circuits that constitute the display portions A, B 6403, 6404. A home game machine is also included in an image reproducing system with a recording medium. According to the invention, the DVD reproducing system shown in FIG. 6E comes to completion.

FIG. 6F shows a goggle type display (a head-mount display) that includes a main body 6501, a display portion 6502, and an arm portion 6503. The invention can be applied to an electric circuit that constitutes the display portion 6502. According to the invention, the goggle type display shown in FIG. 6F comes to completion.

FIG. 6G shows a video camera that includes a main body 6601, a display portion 6602, a chassis 6603, an external connecting port 6604, a remote controlled receiver 6605, a image receiver 6606, a battery 6607, an audio input portion 6608 and an operation key 6609 and the like. The invention can be applied to an electric circuit that constitutes the display portion 6602. According to the invention, the video camera shown in FIG. 6G comes to completion.

FIG. 6H shows a portable telephone that includes a main body 6701, a chassis 6702, a display portion 6703, an audio input port 6704, an audio output port 6705, an operation key 6706, an external connecting port 6707 and an antenna 6708 and the like. The invention can be applied to an electric circuit that constitutes the display portion 6703. When in the display portion 6703 white characters are displayed on a black background, the power consumption of the portable telephone can suppress. According to the invention, the portable telephone shown in FIG. 6H comes to completion.

As shown in the above, a range of applications of the present invention is very wide, that is, the invention can be applied to all fields of electronic devices. Furthermore, the electronic devices shown here may use a semiconductor device having any configuration of those shown in the invention.

The invention claimed is:

1. A method for manufacturing a semiconductor device comprising the steps of:
    forming a gate interconnection over a substrate by discharging a solution containing metal elements;
    forming an island-like insulating layer so as to selectively cover the gate interconnection; and
    forming a source interconnection on a same plane as the gate interconnection by discharging a solution containing metal elements,
    wherein the island-like insulating layer is formed between the gate interconnection and the source interconnection in a region where the gate interconnection and the source interconnection intersect.

2. A method for manufacturing a semiconductor device according to claim 1,
    wherein at least one of the gate interconnection or the source interconnection is formed by discharging a solution containing metal particles.

3. A method for manufacturing a semiconductor device according to claim 1,
    wherein the island-like insulating layer is formed by discharging a solution containing a insulating material.

4. A method for manufacturing a semiconductor device according to claim 1,
    wherein the gate interconnection and the source interconnection are formed by using a laser drawing device.

5. A method for manufacturing a semiconductor device comprising the steps of:
    forming a gate interconnection over a substrate by discharging a solution containing metal elements;
    forming an island-like insulating layer so as to selectively cover the gate interconnection; and
    forming a source interconnection on a same plane as the gate interconnection and the island-like insulating layer by discharging a solution containing metal elements.

6. A method for manufacturing a semiconductor device according to claim 5,
    wherein at least one of the gate interconnection or the source interconnection is formed by discharging a solution containing metal particles.

7. A method for manufacturing a semiconductor device according to claim 5,
    wherein the island-like insulating layer is formed by discharging a solution containing a insulating material.

8. A method for manufacturing a semiconductor device according to claim 5,
    wherein the gate interconnection and the source interconnection are formed by using a laser drawing device.

9. A method for manufacturing a semiconductor device comprising the steps of:
    forming a first interconnection over a substrate by discharging a solution containing metal elements;
    forming an island-like insulating layer so as to selectively cover the first interconnection; and
    forming a second interconnection on a same plane as the first interconnection and the island-like insulating layer by discharging a solution containing metal elements.

10. A method for manufacturing a semiconductor device according to claim 9,
    wherein at least one of the first interconnection or the second interconnection is formed by discharging a solution containing metal particles.

11. A method for manufacturing a semiconductor device according to claim 9,
    wherein the island-like insulating layer is formed by discharging a solution containing a insulating material.

12. A method for manufacturing a semiconductor device according to claim 9,
    wherein the first interconnection and the second interconnection are formed by using a laser drawing device.

* * * * *